US012701908B2

(12) United States Patent
Li et al.

(10) Patent No.: US 12,701,908 B2
(45) Date of Patent: **\*Aug. 4, 2026**

(54) RAPID LAYER-SPECIFIC PHOTONIC ANNEALING OF PEROVSKITE THIN FILMS

(71) Applicant: THE BOARD OF TRUSTEES OF THE UNIVERSITY OF ALABAMA, Tuscaloosa, AL (US)

(72) Inventors: Dawen Li, Tuscaloosa, AL (US); Zhongliang Ouyang, Tuscaloosa, AL (US)

(73) Assignee: THE BOARD OF TRUSTEES OF THE UNIVERSITY OF ALABAMA, Tuscaloosa, AL (US)

( \* ) Notice: Subject to any disclaimer, the term of this patent is extended or adjusted under 35 U.S.C. 154(b) by 500 days.

This patent is subject to a terminal disclaimer.

(21) Appl. No.: 17/880,843

(22) Filed: Aug. 4, 2022

(65) Prior Publication Data

US 2022/0384727 A1 Dec. 1, 2022

Related U.S. Application Data

(63) Continuation-in-part of application No. 16/534,313, filed on Aug. 7, 2019, now Pat. No. 11,444,245.
(Continued)

(51) Int. Cl.
*H10K 71/40* (2023.01)
*H10K 30/50* (2023.01)
(Continued)

(52) U.S. Cl.
CPC ......... *H10K 71/40* (2023.02); *H10K 85/1135* (2023.02); *H10K 85/50* (2023.02); *H10K 30/50* (2023.02)

(58) Field of Classification Search
CPC .... H10K 71/40; H10K 85/1135; H10K 85/50; H10K 30/40
See application file for complete search history.

(56) References Cited

U.S. PATENT DOCUMENTS 5,753,542 A \* 5/1998 Yamazaki ......... H01L 21/02592
438/162
11,094,884 B2 8/2021 Li et al.
(Continued)

FOREIGN PATENT DOCUMENTS

JP H11195613 A \* 7/1999

OTHER PUBLICATIONS

Li, "Laser-assisted crystallization of CH3NH3PbI3 films for efficient perovskite solar cells with a high open-circuit voltage" Chem. Commun., 2016, 52, 5394-5397, and Supplementary Materials pp. 1-8 (Year: 2016).\*
(Continued)

*Primary Examiner* — Devina Pillay
(74) *Attorney, Agent, or Firm* — Meunier Carlin & Curfman LLC

(57) ABSTRACT

Disclosed herein are methods of annealing a perovskite layer, comprising irradiating the perovskite layer with a light source, wherein the light source is a UV light emitting diode or array of UV-LEDs for rapid and large-area exposure without scanning over the perovskite film, wherein the light source emits radiation consisting essentially of wavelengths within 50 nm of the wavelength of maximum absorbance ($\lambda_{max}$) of the perovskite layer, thereby annealing the perovskite layer. Also disclosed herein are semiconducting devices and articles of manufacture comprising an annealed perovskite layer made by any of the methods described
(Continued)

Photonic Annealing

9-12 seconds herein, such as solar cells, light-emitting diodes, photode-tectors, thin-film transistors, laser diodes, and combinations thereof.

15 Claims, 6 Drawing Sheets

Related U.S. Application Data

(60) Provisional application No. 62/748,626, filed on Oct. 22, 2018.

(51) Int. Cl.
     H10K 85/10          (2023.01)
     H10K 85/50          (2023.01)

(56) References Cited

U.S. PATENT DOCUMENTS

| | | | |
|---|---|---|---|
| 2007/0252204 A1* | 11/2007 | Wei | H01L 29/41783 |
| | | | 257/E21.336 |
| 2008/0225099 A1 | 9/2008 | Cohen et al. | |
| 2010/0038833 A1* | 2/2010 | Kasai | H01L 21/67115 |
| | | | 266/250 |
| 2012/0223657 A1* | 9/2012 | Van de Ven | H05B 45/46 |
| | | | 315/297 |
| 2014/0022810 A1 | 1/2014 | Ito et al. | |
| 2018/0211792 A1* | 7/2018 | Mori | H10K 85/111 |
| 2019/0077073 A1 | 3/2019 | Kwisnek et al. | |

OTHER PUBLICATIONS

Park "Crystallization Kinetics of Lead Halide Perovskite Film Monitored by In Situ Terahertz Spectroscopy" J. Phys. Chem. Lett. 2017, 8, 401-406. , and Supplementary Materials pp. 1-10 (Year: 2017).*
Arai, JPH11195613A, Machine Translation (Year: 1999).*
Ahn, et al., "Highly reproducible perovskite solar cells with average efficiency of 18.3% and best efficiency of 19.7% fabricated via Lewis base adduct of lead (II) iodide", Journal of the American Chemical Society 137.27 (2015): 8696-8699.
An, et al., "Improved efficiency of bulk heterojunction polymer solar cells by doping low-bandgap small molecules", ACS applied materials & interfaces 6.9 (2014): 6537-6544.
Arora, et al., "Perovskite solar cells with CuSCN hole extraction layers yield stabilized efficiencies greater than 20%", Science 358.6364 (2017): 768-771.
Asghar, et al., "Device stability of perovskite solar cells—A review", Renewable and Sustainable Energy Reviews 77 (2017): 131-146.
Bi, et al., "Non-wetting surface-driven high-aspect-ratio crystalline grain growth for efficient hybrid perovskite solar cells", Nature communications 6 (2015): 7747.
Bi, et al., "Polymer-templated nucleation and crystal growth of perovskite films for solar cells with efficiency greater than 21%", Nature Energy 1.10 (2016): 16142.
Burschka, et al., "Sequential deposition as a route to high-performance perovskite-sensitized solar cells", Nature, 499.7458 (2013):316.
Chen, et al., "A solvent-and vacuum-free route to large-area perovskite films for efficient solar modules", Nature 550.7674 (2017): 92.
Chiang, et al., "Bulk heterojunction perovskite—PCBM solar cells with high fill factor", Nature Photonics 10.3 (2016): 196.
Correa-Baena, et al., "Promises and challenges of perovskite solar cells", Science 358.6364 (2017): 739-744.
Dequilettes, et al., "Photo-induced halide redistribution in organic-inorganic perovskite films", Nature communications 7 (2016): 11683.
Domanski, et al., "Systematic investigation of the impact of operation conditions on the degradation behaviour of perovskite solar cells", Nature Energy 3.1 (2018): 61.

Im, et al., "Growth of CH3NH3 PbI3 cuboids with controlled size for high-efficiency perovskite solar cells", Nature nanotechnology 9.11 (2014): 927.
Jeon, et al., "Laser crystallization of organic-inorganic hybrid perovskite solar cells", ACS Nano 2016, 10, 7907-7914.
Jeon, et al., "Solvent engineering for high-performance inorganic-organic hybrid perovskite solar cells", Nature materials 13.9 (2014): 897.
Jiang, et al., "Balance lead in solution-processed CH3NH3PbBrxCl(3-x) single crystals for high performance X-ray detection", Material Letters 2019, 236, 26-29.
Jin, et al., "Laser writing block copolymer self-assembly on graphene light-absorbing layer", ACS Nano 2016, 10, 3435-3442.
Kojima, et al., "Organometal Halide Perovskites as Visible-Light Sensitizers for Photovoltaic Cells", J. Am. Chem. Soc. 2009, 131(17), 6050-6051.
Koushik, et al., "High-efficiency humidity-stable planar perovskite solar cells based on atomic layer architecture", Energy & Environmental Science 10.1 (2017): 91-100.
Lavery, et al., "Intense pulsed light sintering of CH3NH3PbI3 solar cells", ACS applied materials & interfaces 8.13 (2016): 8419-8426.
Leguy, et al., "Reversible hydration of CH3NH3PbI3 in films, single crystals, and solar cells", Chemistry of Materials 27.9 (2015): 3397-3407.
Li, et al., "High-efficiency robust perovskite solar cells on ultrathin flexible substrates", Nature communications 7 (2016): 10214.
Li, et al., "Laser-assisted crystallization of CH3NH3PbI3 films for efficient perovskite solar cells with a high open-circuit voltage", Chem Commun 2016, 52, 5394-5397.
Li, et al., "Recent efficient strategies for improving the moisture stability of perovskite solar cells", Journal of Materials Chemistry A 5.30 (2017): 15447-15459.
Liu, et al., "Perovskite solar cells with a planar heterojunction structure perpared using room-temperature solution processing techniques", Nature Photonics 8.2 (2014): 133.
Löper, et al., "Complex refractive index spectra of CH3NH3PbI3 perovskite thin films determined by spectroscopic ellipsometry and spectrophotometry", The journal of physical chemistry letters 6.1 (2014): 66-71.
Luo, et al., "Enhanced photovoltage for inverted planar heterojunction perovskite solar cells", Science 360.6396 (2018): 1442-1446.
Mesquita, et al., "Perovskite solar cells: Materials, configurations and stability", Renewable and Sustainable Energy Reviews 82 (2018): 2471-2489.
Nie, et al., "High-efficiency solution-processed perovskite solar cells with millimeter-scale grains", Science 347.6221 (2015): 522-525.
Nie, et al., "Light-activated photocurrent degradation and self-healing in perovskite solar cells", Nature communications 7 (2016): 11574.
Park, et al., "Crystallization Kinetics of Lead Halide Perovskite Film Monitored by In Situ Tetrahertz Spectroscopy", J Phys Chem Lett 2017, 8, 401-406 and supporting material S1-S10.
Petrus, et al., "Capturing the sun: A review of the challenges and perspectives of perovskite solar cells", Advanced Energy Materials 7.16 (2017): 1700264.
Pool, et al., "Thermal engineering of FAPbI 3 perovskite material via radiative thermal annealing and in situ XRD", Nature communications 8 (2017): 14075.
Rong, et al., "Challenges for commercializing perovskite solar cells", Science 361.6408 (2018):eaat8235.
Tai, et al., "Efficient and stable perovskite solar cells prepared in ambient air irrespective of the humidity", Nature communications 7 (2016): 11105.
Tan, et al., "Efficient and stable solution-processed planar perovskite solar cells via contact passivation", Science 355.6326 (2017): 722-726.
Troughton, et al., "Photonic flash-annealing of lead halide perovskite solar cells in 1 ms", Journal of Materials Chemistry A 4.9 (2016): 3471-3476.
Troughton, et al., "Rapid processing of perovskite solar cells in under 2.5 seconds", Journal of Materials Chemistry A 3.17 (2015): 9123-9127.

(56) References Cited

OTHER PUBLICATIONS

Tsai, et al., "Light-induced lattice expansion leads to high-efficiency perovskite solar cells", Science 360.6384 (2018): 67-70.

Turren-Cruz, et al., "Enhanced charge carrier mobility and lifetime suppress hysteresis and improve efficiency in planar perovskite solar cells", Energy & Environmental Science 11.1 (2018): 78-86.

Varadwaj, et al., "Revealing the Chemistry between Band Gap and Binding Nergy for Lead-/Tin-Based Trihalide Perovskite Solar Cell Semiconductors", ChemSusChem 2018, 11, 449-463.

Wu, et al., "Perovskite solar cells with 18.21% efficiency and area over 1 cm 2 fabricated by heterojunction engineering", Nature Energy 1.11 (2016): 16148.

Yang, et al., "Iodide management in formamidinium-lead-halide-based perovskite layers for efficient solar cells", Science 356.6345 (2017): 1376-1379.

Yang, et al., "Make Perovskite solar cells stable", Nature News 544.7649, (2017):55.

Yang, et al., "Perovskite ink with wide processing window for scalable high-efficiency solar cells", Nature Energy 2.5 (2017): 17038.

You, et al., "Improved air stability of perovskite solar cells via solution-processed metal oxide transport layers", Nature nanotechnology 11.1 (2016): 75.

You, et al., "Low-temperature solution-processed perovskite solar cells with high efficiency and flexibility", ACS nano 8.2 (2014): 1674-1680.

Zhang, et al., "Ultrasmooth organic-inorganic perovskite thin-film formation and crystallization for efficient planar heterojunction solar cells", Nature communications 6 (2015): 6142.

* cited by examiner

RAPID LAYER-SPECIFIC PHOTONIC ANNEALING OF PEROVSKITE THIN FILMS

CROSS-REFERENCE TO RELATED APPLICATIONS

This application is a continuation in part of U.S. application Ser. No. 16/534,313, which claims the benefit of priority to U.S. Provisional Application No. 62/748,626 filed Oct. 22, 2018, each of which is hereby incorporated herein by reference in its entirety.

STATEMENT OF GOVERNMENT SUPPORT

This invention was made with government support under Grant No. ECCS-1151140 awarded by the National Science Foundation. The government has certain rights in the invention.

BACKGROUND

Rapid advances in the power-conversion efficiency (PCE) and low-cost potential from solution-processing of perovskite solar cells (PVSCs) have motivated the development of large-scale production of perovskite thin films on flexible substrates through high-speed printing. Currently, the record efficiency of perovskite solar cells at the lab scale on glass substrates has surpassed 20%-25%, which is comparable to that of the commercialized photovoltaic technologies, including bulk crystalline silicon (c-Si) based photovoltaics (PV), as well as cadmium telluride (CdTe) and copper indium gallium selenide (CIGS) thin film solar cells with power-conversion efficiencies of ~21%. Among these mature photovoltaic technologies, the first generation c-Si solar cells dominate the photovoltaic market with roughly a 90% stake, while the second generation CdTe and CIGS thin film solar cells share the remaining 10%. Manufacturing of c-Si solar cells remains challenging because of the energy-intensive processing, while CdTe and CIGS solar cells are limited by the manufacturing complexity and scarce supply of source materials. Because of the comparable efficiency and solution processing capability for low-cost mass production through roll-to-roll (R2R) printing, perovskite (PVSK) based photovoltaics are an attractive alternative for the renewable energy market.

Several obstacles exist for industrialization of perovskite solar cells, including instability and life-time issues; long annealing times, which hold back the ability to use high-speed roll-to-roll printing; and decreased efficiency, which is related to scaled-up fabrication on flexible substrates. Currently the highest power-conversion efficiency of fully printed perovskite solar cells on flexible substrates is far below the champion efficiency at lab scale on glass substrates, indicating much room for improvement. Beyond photovoltaics, perovskites are of interest for applications in various semiconductor devices (e.g., light emitting diodes (LEDs), lasers, photodetectors, thin-film transistors, sensors, etc.) due to their electrical and optical properties, such as long carrier diffusion lengths and optical bandgaps. An improved method for fabricating perovskite thin films is needed for the various applications of perovskites to the photovoltaics and other semiconductor devices. The methods and devices described herein addresses these and other needs.

SUMMARY

In accordance with the purposes of the disclosed materials, devices, and methods, as embodied and broadly described herein, the disclosed subject matter relates to methods of annealing perovskites.

Additional advantages of the disclosed compositions and methods will be set forth in part in the description which follows, and in part will be obvious from the description. The advantages of the disclosed compositions will be realized and attained by means of the elements and combinations particularly pointed out in the appended claims. It is to be understood that both the foregoing general description and the following detailed description are exemplary and explanatory only and are not restrictive of the disclosed compositions, as claimed.

The details of one or more embodiments of the invention are set forth in the accompanying drawings and the description below. Other features, objects, and advantages of the invention will be apparent from the description and drawings, and from the claims.

BRIEF DESCRIPTION OF THE FIGURES

The accompanying figures, which are incorporated in and constitute a part of this specification, illustrate several aspects of the disclosure, and together with the description, serve to explain the principles of the disclosure.

DETAILED DESCRIPTION

Figure 1:
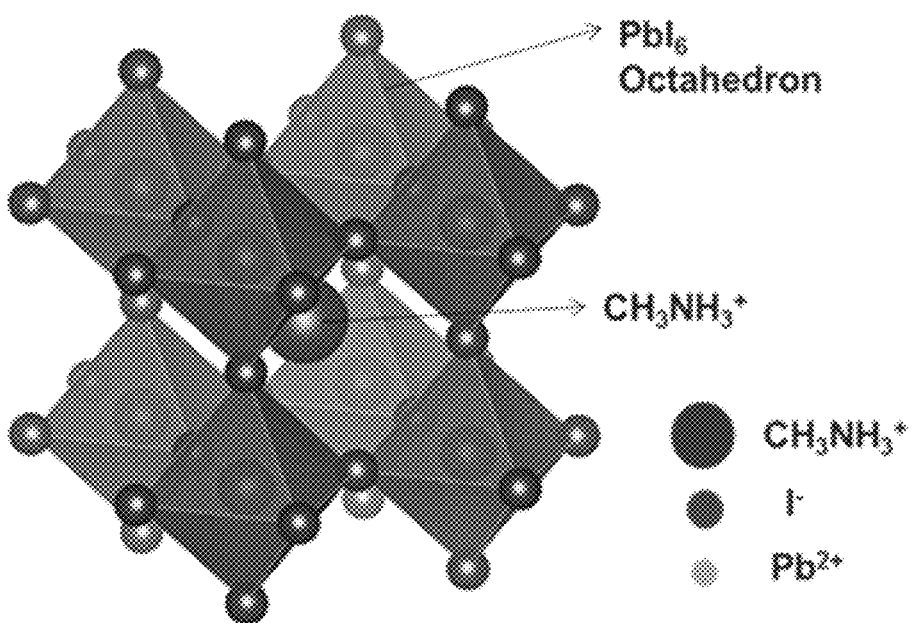
FIG. 1 is a schematic diagram of a crystal of $CH_3NH_3PbI_3$ perovskite.

The compositions and methods described herein may be understood more readily by reference to the following detailed description of specific aspects of the disclosed subject matter and the Examples included therein.

Before the present compositions and methods are disclosed and described, it is to be understood that the aspects described below are not limited to specific synthetic methods or specific reagents, as such may, of course, vary. It is also to be understood that the terminology used herein is for the purpose of describing particular aspects only and is not intended to be limiting.

Also, throughout this specification, various publications are referenced. The disclosures of these publications in their entireties are hereby incorporated by reference into this application in order to more fully describe the state of the art to which the disclosed matter pertains. The references disclosed are also individually and specifically incorporated by reference herein for the material contained in them that is discussed in the sentence in which the reference is relied upon.

In this specification and in the claims that follow, reference will be made to a number of terms, which shall be defined to have the following meanings.

Throughout the description and claims of this specification the word "comprise" and other forms of the word, such as "comprising" and "comprises," means including but not limited to, and is not intended to exclude, for example, other additives, components, integers, or steps.

As used in the description and the appended claims, the singular forms "a," "an," and "the" include plural referents unless the context clearly dictates otherwise. Thus, for example, reference to "a composition" includes mixtures of two or more such compositions, reference to "an agent" includes mixtures of two or more such agents, reference to "the component" includes mixtures of two or more such components, and the like.

"Optional" or "optionally" means that the subsequently described event or circumstance can or cannot occur, and that the description includes instances where the event or circumstance occurs and instances where it does not.

Ranges can be expressed herein as from "about" one particular value, and/or to "about" another particular value. By "about" is meant within 5% of the value, e.g., within 4, 3, 2, or 1% of the value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

It is understood that throughout this specification the identifiers "first" and "second" are used solely to aid in distinguishing the various components and steps of the disclosed subject matter. The identifiers "first" and "second" are not intended to imply any particular order, amount, preference, or importance to the components or steps modified by these terms.

References in the specification and concluding claims to parts by weight of a particular element or component in a composition denotes the weight relationship between the element or component and any other elements or components in the composition or article for which a part by weight is expressed. Thus, in a compound containing 2 parts by weight of component X and 5 parts by weight component Y, X and Y are present at a weight ratio of 2:5 and are present in such ratio regardless of whether additional components are contained in the compound.

A weight percent (wt. %) of a component, unless specifically stated to the contrary, is based on the total weight of the formulation or composition in which the component is included.

Reference will now be made in detail to specific aspects of the disclosed materials, compounds, compositions, formulations, articles, and methods, examples of which are illustrated in the accompanying Examples and Figures.

The present disclosure relates to perovskite films and devices comprising the perovskite films, such as perovskite solar cells. Specifically disclosed herein are perovskite solar cells that can be manufactured by roll-to-roll printing while still exhibiting high efficiency. Methods for producing an annealed perovskite layer whereby a perovskite layer is deposited on a substrate and is subsequently annealed and/or sintered are also provided. The resulting perovskite film may form at least a portion of any electronic device suitable for including a perovskite material, such as, but not limited to, a solar cell, a light emitting diode (LED), a laser, a photo-detector, a thin-film transistor, a sensor, or a combination thereof.

Described herein are methods of annealing a perovskite layer. The methods disclosed herein provide rapid annealing of perovskite films with good crystallinity and improved efficiency compared to perovskite films prepared by conventional hot-plate annealing methods, paving the way for low-cost manufacturing through roll-to-roll printing. In contrast, lengthy and tedious thermal annealing using a hot plate is not compatible with high-speed printing.

In the methods disclosed herein, rapid irradiation from light-emitting diodes (LEDs) is utilized to attain highly selective annealing and sintering. By choosing a suitable wavelength and, if the light is pulsed, manipulating pulse width, LED irradiation is capable of accomplishing layer-specific photonic treatment of perovskite layers without affecting the underlying layers. The disclosed methods can attain high-quality perovskite films from rapid annealing, (e.g., rapid LED annealing), but also maintain the efficiency, achieving the best of both worlds in device performance.

Conventionally, once the perovskite layer has been deposited, in some embodiments, the layers then undergo a heat annealing process by exposure to an elevated temperature to form a more uniform and crystalline film. Unlike prior methods of forming a perovskite film, however, and in particular those that make use of methylammonium lead iodide perovskite layers, the presently-described methods do not utilize an annealing process whereby heat (e.g., heating to a temperature higher than 100° C. but less than 150° C.) is applied over a longer period of time, such as by use of a heating plate or an oven. Rather, in the presently disclosed methods, the perovskite layer can be post-treated with a light source as described herein. The light source can provide rapid annealing in which light of selected wavelength(s) is directed towards and absorbed by the perovskite material. In some examples, to control the transformation of the perovskite layer during the irradiation process and/or the absorbed energy of the light, the radiation process can be carried out by using one or a series of short pulses (that is, an intense pulsed light (IPL) sintering process is utilized).

Described herein are methods of annealing a perovskite layer, comprising irradiating the perovskite layer with a light source, wherein the light source emits radiation, thereby annealing the perovskite layer. The light source emits radiation consisting essentially of wavelengths within 50 nanometers (nm) of the wavelength of maximum absorbance ($\lambda_{max}$) of the perovskite layer (e.g., within 45 nm of $\lambda_{max}$ of the perovskite layer, within 40 nm of $\lambda_{max}$ of the perovskite layer, within 35 nm of $\lambda_{max}$ of the perovskite layer, within 30 nm of $\lambda_{max}$ of the perovskite layer, within 25 nm of $\lambda_{max}$ of the perovskite layer, within 20 nm of $\lambda_{max}$ of the perovskite layer, within 15 nm of $\lambda_{max}$ of the perovskite layer, within 10 nm of $\lambda_{max}$ of the perovskite layer, or within 5 nm of $\lambda_{max}$ of the perovskite layer). In some examples, the light source emits radiation having a wavelength equivalent to $\lambda_{max}$ of the perovskite layer. In some examples, at least a portion of the radiation emitted by the light source is absorbed by the perovskite thin film, thereby annealing the perovskite layer. For example, the perovskite film can absorb of at least a portion of the radiation emitted by the light source, wherein the absorbed radiation supplied energy for crystallization of the perovskite layer, thereby annealing the perovskite layer.

In some examples, the light source can emit radiation having a spectral width of 50 nm or less (e.g., 45 nm or less, 40 nm or less, 35 nm or less, 30 nm or less, 25 nm or less, 20 nm or less, 15 nm or less, 10 nm or less, or 5 nm or less).

The light source can be configured to emit radiation having a narrow spectral width. For example, the light source can emit radiation having a spectral width of 10 nm or less (e.g., 9 nm or less, 8 nm or less, 7 nm or less, 6 nm or less, or 5 nm or less). In some examples, the light source can be configured to emit a single wavelength.

The wavelength of light used will depend on the wavelength of maximum absorption ($\lambda_{max}$) of the perovskite layer.

In some examples, $\lambda_{max}$ of the perovskite layer can be 250 nm or more (e.g., 255 nm or more, 260 nm or more, 265 nm or more, 270 nm or more, 275 nm or more, 280 nm or more, 285 nm or more, 290 nm or more, 300 nm or more, 305 nm or more, 310 nm or more, 315 nm or more, 320 nm or more, 325 nm or more, 330 nm or more, 335 nm or more, 340 nm or more, 345 nm or more, 350 nm or more, 355 nm or more, 360 nm or more, 365 nm or more, 370 nm or more, 375 nm or more, 380 nm or more, or 385 nm or more). In some examples, $\lambda_{max}$ of the perovskite layer can be 400 nm or less (e.g., 395 nm or less, 390 nm or less, 385 nm or less, 380 nm or less, 375 nm or less, 370 nm or less, 365 nm or less, 360 nm or less, 355 nm or less, 350 nm or less, 345 nm or less, 340 nm or less, 335 nm or less, 330 nm or less, 325 nm or less, 320 nm or less, 315 nm or less, 310 nm or less, 305 nm or less, 300 nm or less, 295 nm or less, 290 nm or less, 285 nm or less, 280 nm or less, 275 nm or less, 270 nm or less, 265 nm or less, 260 nm or less, or 255 nm or less). The $\lambda_{max}$ of the perovskite layer can range from any of the minimum values described above to any of the maximum values described above. For example, $\lambda_{max}$ of the perovskite layer can be from 250 nm to 400 nm (e.g., from 250 nm to 325 nm, from 325 nm to 400 nm, from 250 nm to 300 nm, from 300 nm to 350 nm, from 350 nm to 400 nm, or from 275 nm to 375 nm).

In some examples, $\lambda_{max}$ of the perovskite layer can be 300 nm or more (e.g., 305 nm or more, 310 nm or more, 315 nm or more, 320 nm or more, 325 nm or more, 330 nm or more, 335 nm or more, 340 nm or more, 345 nm or more, 350 nm or more, 355 nm or more, 360 nm or more, 365 nm or more, 370 nm or more, 375 nm or more, 380 nm or more, or 385 nm or more). In some examples, $\lambda_{max}$ of the perovskite layer can be 400 nm or less (e.g., 395 nm or less, 390 nm or less, 385 nm or less, 380 nm or less, 375 nm or less, 370 nm or less, 365 nm or less, 360 nm or less, 355 nm or less, 350 nm or less, 345 nm or less, 340 nm or less, 335 nm or less, 330 nm or less, 325 nm or less, 320 nm or less, or 315 nm or less). The $\lambda_{max}$ of the perovskite layer can range from any of the minimum values described above to any of the maximum values described above. For example, $\lambda_{max}$ of the perovskite layer can be from 300 nm to 400 nm (e.g., from 300 nm to 350 nm, from 350 nm to 400 nm, from 300 nm to 325 nm, from 325 nm to 350 nm, from 350 nm to 375 nm, from 375 nm to 400 nm, from 325 nm to 400 nm, from 340 nm to 380 nm, or from 350 nm to 370 nm).

In some examples, the light source is a UV light emitting diode or array of UV-LEDs for rapid and large-area exposure without scanning over the perovskite film.

In some examples, the light source is a UV light emitting diode.

In some examples, the perovskite layer can be irradiated for a total amount of time of 1 minute or less (e.g., 50 seconds or less, 40 seconds or less, 30 seconds or less, 20 seconds or less, 10 seconds or less, 5 seconds or less, 1 second or less, 750 milliseconds (ms) or less, 500 ms or less, 400 ms or less, 300 ms or less, 250 ms or less, 200 ms or less, 150 ms or less, 125 ms or less, 100 ms or less, 75 ms or less, 50 ms or less, 40 ms or less, 30 ms or less, 20 ms or less, or 10 ms or less), depending on the intensity of the irradiation. In some examples, the perovskite layer can be irradiated for a total amount of time of 1 millisecond (ms) or more (e.g., 5 ms or more, 10 ms or more, 20 ms or more, 30 ms or more, 40 ms or more, 50 ms or more, 75 ms or more, 100 ms or more, 125 ms or more, 150 ms or more, 200 ms or more, 250 ms or more, 300 ms or more, 400 ms or more, 500 ms or more, 750 ms or more, 1 second or more, 5 seconds or more, 10 seconds or more, 20 seconds or more, 30 seconds or more, or 40 seconds or more), depending on the intensity of the irradiation. The total amount of time the perovskite layer is irradiated can range from any of the minimum values described above to any of the maximum values described above. For example, the perovskite layer can be irradiated for a total amount of time of from 1 millisecond to 1 minute (e.g., from 1 ms to 1 second, from 1 second to 1 minute, from 1 ms to 100 ms, from 100 ms to 1 second, from 1 second to 10 seconds, from 10 seconds to 1 minute, or from 5 ms to 30 seconds), depending on the intensity of the irradiation.

In some examples, the light source can emit pulsed radiation and irradiating the perovskite layer comprises applying a plurality of pulses, wherein each pulse can be 1 minute or less in duration (e.g., 50 seconds or less, 40 seconds or less, 30 seconds or less, 20 seconds or less, 10 seconds or less, 5 seconds or less, 1 second or less, 750 milliseconds (ms) or less, 500 ms or less, 400 ms or less, 300 ms or less, 250 ms or less, 200 ms or less, 150 ms or less, 125 ms or less, 100 ms or less, 75 ms or less, 50 ms or less, 40 ms or less, 30 ms or less, 20 ms or less, or 10 ms or less, 5 ms or less, 1 ms or less, 750 microseconds or less, 500 microseconds or less, 400 microseconds or less, 300 microseconds or less, 250 microseconds or less, 200 microseconds or less, 150 microseconds or less, 125 microseconds or less, 100 microseconds or less, 75 microseconds or less, 50 microseconds or less, 40 microseconds or less, 30 microseconds or less, 20 microseconds or less, 10 microseconds or less, or 5 microseconds or less). In some examples, the perovskite layer can be irradiated with a plurality of pulses, wherein each pulse can be 1 microsecond or more in duration (e.g., 5 microseconds or more, 10 microseconds or more, 20 microseconds or more, 30 microseconds or more, 40 microseconds or more, 50 microseconds or more, 75 microseconds or more, 100 microseconds or more, 125 microseconds or more, 150 microseconds or more, 200 microseconds or more, 250 microseconds or more, 300 microseconds or more, 400 microseconds or more, 500 microseconds or more, 750 microseconds or more, 1 millisecond (ms) or more, 5 ms or more, 10 ms or more, 20 ms or more, 30 ms or more, 40 ms or more, 50 ms or more, 75 ms or more, 100 ms or more, 125 ms or more, 150 ms or more, 200 ms or more, 250 ms or more, 300 ms or more, 400 ms or more, 500 ms or more, 750 ms or more, 1 second or more, 5 seconds or more, 10 seconds or more, 20 seconds or more, 30 seconds or more, or 40 seconds or more). The duration of each pulse in the plurality of pulses applied to the perovskite layer can range from any of the minimum values described above to any of the maximum values described above. For example, the perovskite layer can be irradiated with a plurality of pulses, wherein each pulse can have a duration of from 1 microsecond to 1 minute (e.g., from 1 microsecond to 500 ms, from 500 ms to 1 minute, from 1 microsecond to 1 ms, from 1 ms to 1 second, from 1 second to 1 minute, from 1 microsecond to 100 microseconds, from 100 microseconds to 1 ms, from 1 ms to 100 ms, from 100 ms to 1 second, from 1 second to 10 seconds, from 10 seconds to 1 minute, or from 5 microseconds to 30 seconds).

In some examples, the light source can emit pulsed radiation and irradiating the perovskite layer comprises applying a plurality of pulses, wherein each pulse can be 1 minute or less in duration (e.g., 50 seconds or less, 40 seconds or less, 30 seconds or less, 20 seconds or less, 10 seconds or less, 5 seconds or less, 1 second or less, 750 milliseconds (ms) or less, 500 ms or less, 400 ms or less, 300 ms or less, 250 ms or less, 200 ms or less, 150 ms or less, 125 ms or less, 100 ms or less, 75 ms or less, 50 ms or less, 40 ms or less, 30 ms or less, 20 ms or less, or 10 ms or less). In some examples, the perovskite layer can be irradiated with a plurality of pulses, wherein each pulse can be 1 millisecond (ms) or more in duration (e.g., 5 ms or more, 10 ms or more, 20 ms or more, 30 ms or more, 40 ms or more, 50 ms or more, 75 ms or more, 100 ms or more, 125 ms or more, 150 ms or more, 200 ms or more, 250 ms or more, 300 ms or more, 400 ms or more, 500 ms or more, 750 ms or more, 1 second or more, 5 seconds or more, 10 seconds or more, 20 seconds or more, 30 seconds or more, or 40 seconds or more). The duration of each pulse in the plurality of pulses applied to the perovskite layer can range from any of the minimum values described above to any of the maximum values described above. For example, the perovskite layer can be irradiated with a plurality of pulses, wherein each pulse can have a duration of from 1 millisecond to 1 minute (e.g., from 1 ms to 1 second, from 1 second to 1 minute, from 1 ms to 100 ms, from 100 ms to 1 second, from 1 second to 10 seconds, from 10 seconds to 1 minute, or from 5 ms to 30 seconds).

The term "perovskite," as used herein, refers to a material having the general structural formula $QZX_3$, wherein Q and Z are cations of different sizes and X is an anion. The skilled person will also appreciate a perovskite material could be represented by the formula $[Q][Z][X]_3$, wherein Q is at least one cation, Z is at least one cation and X is at least one anion. In some embodiments, the "Q" component of the material is selected from methylammonium $CH_3NH_3$ (MA), formamidinum $CH(NH_2)_2$ (FA), n-butylammonium, tetra-butylammonium $C_4H_9NH_3$ (BA), Cs, and combinations thereof; the Z component is selected from an element such as Pb, Sn, Ge, or combinations thereof; and the X component is selected from a halogen such as I, Cl, Br and variants thereof. In some embodiments, the "Q" component of the material is selected from methylammonium $CH_3NH_3$ (MA), formamidinum $CH(NH_2)_2$ (FA), n-butylammonium, tetra-butylammonium $C_4H_9NH_3$ (BA), and combinations thereof; the Z component is selected from a transition metal such as Pb, Sn, Cs, or combinations thereof; and the X component is selected from a halogen such as I, Cl, Br and variants thereof. Additionally or alternatively, in the case of an organometal halide, the Q site refers to an organic group, Z represents a metal such as lead, cesium, or tin, and X is a halide group such as iodide, chloride, fluoride, or bromide. For example, suitable perovskite materials include, but are not limited to, materials selected from the group consisting of: $MAPbI_3$, $MAPbBr_3$, $MAPbI_xBr_{3-x}$, $MAPbI_xCl_3$, $FAPbI_3$, $FAPbBr_3$, $FAPbI_xBr_{3-x}$, $FAPbI_xCl_{3-x}$, $BAPbI_3$, $BAPbBr_3$, $BAPbI_xBr_{3-x}$, $BAPbI_xCl_{3-x}$, $MASnI_3$, $MASnBr_3$, $MASnI_xBr_{3-x}$, $FASnI_3$, $FASnBr_3$, $FASnI_xBr_{3-x}$, $FASnI_xCl_{3-x}$, $BASnI_3$, $BASnBr_3$, $BASnI_xBr_{3-x}$, $BASnI_xCl_{3-x}$, $FA_yCs_zMA_{1-y-z}(I_1Br_x)_3$, $FA_yCs_zMA_{1-y-z}Pb(I_{1-x}, Br_x)_3$, and combinations and mixtures thereof. In some examples, the perovskite layer comprises $CH_3NH_3PbI_3$ ($MAPbI_3$). In some examples, the perovskite layer is prepared by a solution processing technique, such as spin coating or a roll-to-roll printing process. The perovskite layers can be derived from a perovskite material as described herein.

The perovskite layer can, for example, have an average thickness of 300 nm or more (e.g., 325 nm or more, 350 nm or more, 375 nm or more, 400 nm or more, 425 nm or more, 450 nm or more, 475 nm or more, 500 nm or more, 550 nm or more, 600 nm or more, 650 nm or more, 700 nm or more, 750 nm or more, 800 nm or more, 850 nm or more, or 900 nm or more). In some examples, the perovskite layer can have an average thickness of 1000 nm or less (e.g., 950 nm or less, 900 nm or less, 850 nm or less, 800 nm or less, 750 nm or less, 700 nm or less, 650 nm or less, 600 nm or less, 550 nm or less, 500 nm or less, 475 nm or less, 450 nm or less, 425 nm or less, 400 nm or less, 375 nm or less, or 350 nm or less). The average thickness of the perovskite layer can range from any of the minimum values described above to any of the maximum values described above For example, the perovskite layer can have an average thickness of from 300 nm to 1000 nm (e.g., from 300 nm to 650 nm from 650 nm to 1000 nm, from 300 nm to 400 nm, from 400 nm to 500 nm, from 500 nm to 600 nm, from 600 nm to 700 nm, from 700 nm to 800 nm, from 800 nm to 900 nm, from 900 nm to 1000 nm, from 300 nm to 500 nm, or from 400 nm to 900 nm). The thickness of the perovskite layer can be determined by cross-sectional scanning electron microscopy.

Also described herein are annealed perovskite layers made by any of the methods described herein. Also disclosed herein are devices and articles of manufacture comprising an annealed perovskite layer made by any of the methods described herein, such as semiconducting devices. Examples of semiconducting devices include, but are not limited to, solar cells, light-emitting diodes, photodetectors, thin-film transistors, laser diodes, and combinations thereof.

Also disclosed herein are solar cells comprising an annealed perovskite layer made by any of the methods described herein. In some examples, the solar cells can further comprise a hole transport layer; an electron transport layer; an anode; a cathode; or a combination thereof.

The anode and/or cathode can comprise any suitable material, such as those known in the art. In some examples, the anode and/or cathode can comprise a graphene-based transparent conducting electrode. In some examples, the anode and/or cathode can comprise a transparent conducting oxide, such as indium doped tin oxide (ITO), tin doped indium oxide, fluorine doped tin oxide (FTO), and combinations thereof. In some examples, the transparent conducting oxide comprises indium tin oxide. In some examples, the graphene-based transparent conducting electrode and/or the transparent conducting oxide is/are coated on a substrate, such as a rigid substrate (e.g., glass) or a flexible substrate. In some examples, the graphene-based transparent conducting electrode and/or the transparent conducting oxide is/are coated on a flexible transparent substrate. Suitable flexible substrates include, but are not limited to, polymers, such as plastics. In some examples, the anode and/or cathode comprises a flexible transparent conducting layer. In some examples, the anode and/or cathode comprises a rigid transparent conducting layer.

The hole transport layer can comprise any suitable material, such as those known in the art. In some examples, the hole transport layer can comprise poly(3,4-ethylenedioxythiophene) polystyrene sulfonate (PEDOT:PSS); $N^2,N^2,N^{2'}, N^{2'},N^7,N^7,N^{7'},N^{7'}$-octakis(4-methoxyphenyl)-9,9'-spirobi

9

[9H-fluorene]-2,2',7,7'-tetramine (Spiro MeOTAD); derivatives thereof; or combinations thereof. In some examples, the hole transport layer can comprise a metal oxide, for example an oxide of nickel, chromium, molybdenum, copper, tungsten, vanadium, or a mixture thereof. Specific examples of metal oxides that can be used as the hole transport materials include $NiO_x$, $CuO_x$, $CrO_x$, $MoO_x$, $WO_3$, $V_2O_5$, or a combination thereof. In some example, the hole transport layer comprises nickel oxide.

The hole transport layer can, for example, have an average thickness of 10 nm or more (e.g., 15 nm or more, 20 nm or more, 25 nm or more, 30 nm or more, 35 nm or more, 40 nm or more, 45 nm or more, 50 nm or more, 60 nm or more, 70 nm or more, 80 nm or more, 90 nm or more, 100 nm or more, 125 nm or more, 150 nm or more, or 175 nm or more). In some examples, the hole transport layer can have an average thickness of 200 nm or less (e.g., 175 nm or less, 150 nm or less, 125 nm or less, 100 nm or less, 90 nm or less, 80 nm or less, 70 nm or less, 60 nm or less, 50 nm or less, 45 nm or less, 40 nm or less, 35 nm or less, 30 nm or less, 25 nm or less, or 20 nm or less). The average thickness of the hole transport layer can range from any of the minimum values described above to any of the maximum values described above. For example, the hole transport layer can have an average thickness of from 10 nm to 200 nm (e.g., from 10 nm to 100 nm, from 100 nm to 200 nm, from 10 nm to 50 nm, from 50 nm to 100 nm, from 100 nm to 150 nm, from 150 nm to 200 nm, from 20 nm to 200 nm, or from 20 nm to 175 nm).

The electron transport layer can comprise any suitable material, such as those known in the art. In some examples, the electron transport layer comprises a fullerene derivative, such as phenyl-$C_{61}$-butyric acid methyl ester ($PC_{61}BM$) and/or phenyl-$C_{71}$-butyric acid methyl ester ($PC_{71}BM$). In some examples, the electron transport layer can comprise a metal oxide, for example an oxide of titanium, tin, zinc, niobium, tantalum, tungsten, indium, gallium, neodinium, palladium or cadmium, or a mixture thereof. For instance, the electron transport layer can comprise $TiO_2$, $SnO_2$, ZnO, $Nb_2O_5$, $Ta_2O_5$, $WO_3$, $W_2O_5$, $In_2O_3$, $Ga_2O_3$, $Nd_2O_3$, PbO, CdO, or combinations thereof. In some examples, the electron transport layer comprises tin oxide.

The electron transport layer can, for example, have an average thickness of 10 nm or more (e.g., 15 nm or more, 20 nm or more, 25 nm or more, 30 nm or more, 35 nm or more, 40 nm or more, 45 nm or more, 50 nm or more, 55 nm or more, 60 nm or more, 65 nm or more, 70 nm or more, 75 nm or more, 80 nm or more, 85 nm or more, or 90 nm or more). In some examples, the electron transport layer can have an average thickness of 100 nm or less (e.g., 95 nm or less, 90 nm or less, 85 nm or less, 80 nm or less, 75 nm or less, 70 nm or less, 65 nm or less, 60 nm or less, 55 nm or less, 50 nm or less, 45 nm or less, 40 nm or less, 35 nm or less, 30 nm or less, 25 nm or less, or 20 nm or less). The average thickness of the electron transport layer can range from any of the minimum values described above to any of the maximum values described above. For example, the electron transport layer can have an average thickness of from 10 nm to 100 nm (e.g., from 10 nm to 55 nm, from 55 nm to 100 nm, from 10 nm to 40 nm, from 40 nm to 70 nm, from 70 nm to 100 nm, from 20 nm to 100 nm, or from 20 nm to 90 nm).

In some examples, the cathode can comprise a layer of metal. In some examples, the cathode comprises Al, Ag, Cu, Au, Pt, or a combination thereof.

In some examples, the solar cell can be prepared by a solution processing technique, such as spin coating or a roll-to-roll printing process.

In some examples, the solar cell comprises an annealed perovskite layer, a hole transport layer, and an anode, wherein the hole transport layer is disposed between the anode and the annealed perovskite layer such that the hole transport layer is in physical contact with the anode and the annealed perovskite layer. In some examples, the solar cell comprises an annealed perovskite layer, a hole transport layer, and an electron transport layer, wherein the annealed perovskite layer is disposed between the hole transport layer and the electron transport layer such that the annealed perovskite layer is in physical contact with the hole transport layer and the electron transport layer. In some examples, the solar cell comprises an annealed perovskite layer, an electron transport layer, and a cathode, wherein the electron transport layer is disposed between the annealed perovskite layer and the cathode such that the electron transport layer is in physical contact with the annealed perovskite layer and the cathode.

In some examples, the solar cell comprises an annealed perovskite layer, a hole transport layer, an electron transport layer, an anode, and a cathode, wherein the hole transport layer is disposed between the anode and the annealed perovskite layer such that the hole transport layer is in physical contact with the anode and the annealed perovskite layer, wherein the annealed perovskite layer is disposed between the hole transport layer and the electron transport layer such that the annealed perovskite layer is in physical contact with the hole transport layer and the electron transport layer, and wherein the electron transport layer is disposed between the annealed perovskite layer and the cathode such that the electron transport layer is in physical contact with the annealed perovskite layer and the cathode.

Also disclosed herein are methods of forming solar cells, the methods comprising, in any order: depositing a hole transport layer on an anode; depositing a perovskite layer on the hole transport layer; depositing an electron transport layer on the perovskite layer; and irradiating the solar cell with a light source configured to anneal the perovskite layer, wherein the light source emits radiation consisting essentially of wavelengths within 50 nm of the wavelength of maximum absorbance ($\lambda_{max}$) of the perovskite layer, thereby annealing the perovskite layer and forming the solar cell. In some examples, the perovskite layer absorbs at least a portion of the radiation emitted by the light source, thereby annealing the perovskite layer and forming the solar cell. In some examples, the solar cell is made by a solution processing technique, such as spin coating or a roll-to-roll printing process. In some examples, the anode is flexible, such that the solar cell can be manufactured in a roll-to-roll printing process. In some examples, the methods can further comprise depositing a cathode on the electron transport layer.

In some examples, the perovskite layer is disposed between the hole transport layer and the electron transport layer such that the perovskite layer is in physical contact with the hole transport layer and the electron transport layer; the electron transport layer is disposed between the perovskite layer and the cathode such that the electron transport layer is in physical contact with the perovskite layer and the cathode; the hole transport layer is disposed between the anode and the perovskite layer such that the hole transport layer is in physical contact with the anode and the perovskite layer; or a combination thereof.

Depositing the hole transport layer, the perovskite layer, and/or the electron transport layer, can, for example, comprise printing, spin coating, drop-casting, zone casting, dip coating, blade coating, spraying, vacuum filtration, slot die coating, curtain coating, or combinations thereof. Depositing the anode and/or the cathode can comprise, for example, printing, lithographic deposition, electron beam deposition, thermal deposition, spin coating, drop-casting, zone casting, dip coating, blade coating, spraying, vacuum filtration, slot die coating, curtain coating, or combinations thereof.

In some examples, the methods can further include forming the perovskite layer. Methods of depositing perovskite layers are known. For instance, methods of forming a methylammonium lead iodide ($CH_3NH_3PbI_3$) perovskite layer can include first applying a lead iodide ($PbI_2$) layer. The $PbI_2$ layer can be applied by any suitable method, such as, spin coating followed by heating or irradiating the layer with a light source. After forming the $PbI_2$ layer, the coated substrate can be exposed to a conversion solution configured to grow perovskite crystal thereof. In one embodiment, the conversion solution includes methylammonium iodide (MAI) and/or a mixture of MAI and anhydrous isopropanol. In some embodiments, the substrate can be dipped in the mixture of MAI and anhydrous isopropanol for 90 seconds followed by annealing with a light source as disclosed herein.

In an alternate embodiment, the perovskite layer can be formed by dissolving $PbI_2$ and a methyl-ammonium precursor in a solvent to form a perovskite precursor composition, spin coating the perovskite precursor composition, then annealing with a light source as disclosed herein.

By way of non-limiting illustration, examples of certain examples of the present disclosure are given below.

EXAMPLES

The following examples are set forth below to illustrate the methods and results according to the disclosed subject matter. These examples are not intended to be inclusive of all aspects of the subject matter disclosed herein, but rather to illustrate representative methods and results. These examples are not intended to exclude equivalents and variations of the present invention which are apparent to one skilled in the art.

Efforts have been made to ensure accuracy with respect to numbers (e.g., amounts, temperature, etc.) but some errors and deviations should be accounted for. Unless indicated otherwise, parts are parts by weight, temperature is in ° C. or is at ambient temperature, and pressure is at or near atmospheric. There are numerous variations and combinations of measurement conditions, e.g., component concentrations, temperatures, pressures and other measurement ranges and conditions that can be used to optimize the described process.

Example 1

Perovskites are direct band semiconductors with high light absorption coefficients in the visible and ultraviolet range. A band gap of ~1.5 eV is optimal for sunlight absorption, e.g., for use of perovskite materials in solar cells, while the band gap of perovskite materials used for light emitting diodes (LEDs), lasers, and photodetectors are tunable based on the desired applications. Perovskites exhibit good charge transport properties with long diffusion lengths. Perovskites are solution processable for cost-effective coating and printing.

Perovskite solar cells have attracted tremendous attention since 2009. The efficiency of perovskite solar cells have risen dramatically from the initial 3.8% up to 23.0%-25.0%, which is comparable to, or even better than, commercial multicrystalline silicon (21.25%), CIGS (21.7%), and CdTe (21.5%) solar cells.

Figure 2:
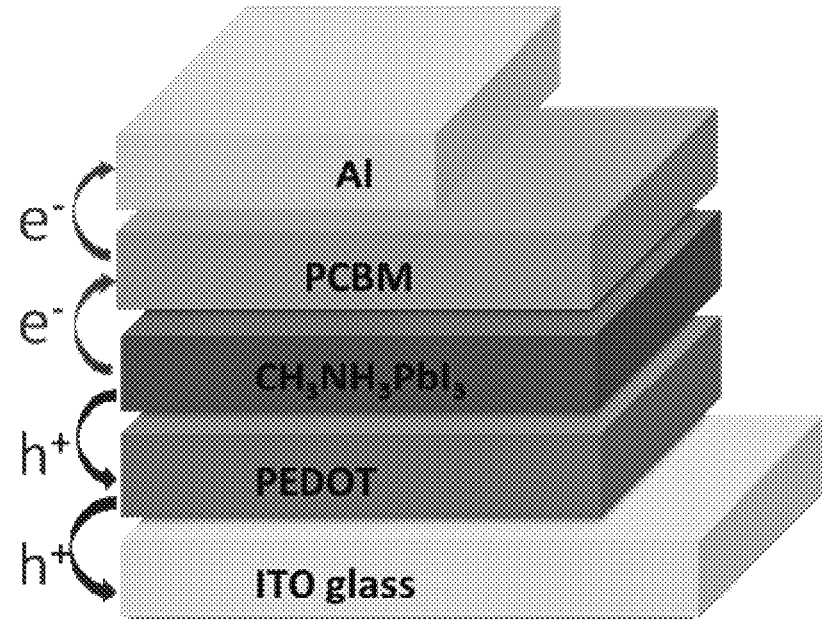
FIG. 2 is a diagram of an inverted perovskite solar cell with an architecture of anode (ITO substrate)/hole transport layer (PEDOT:PSS)/Perovskite $(CH_3NH_3PbI_3)$/electron transport layer (PCBM)/cathode (Al).
Figure 3:
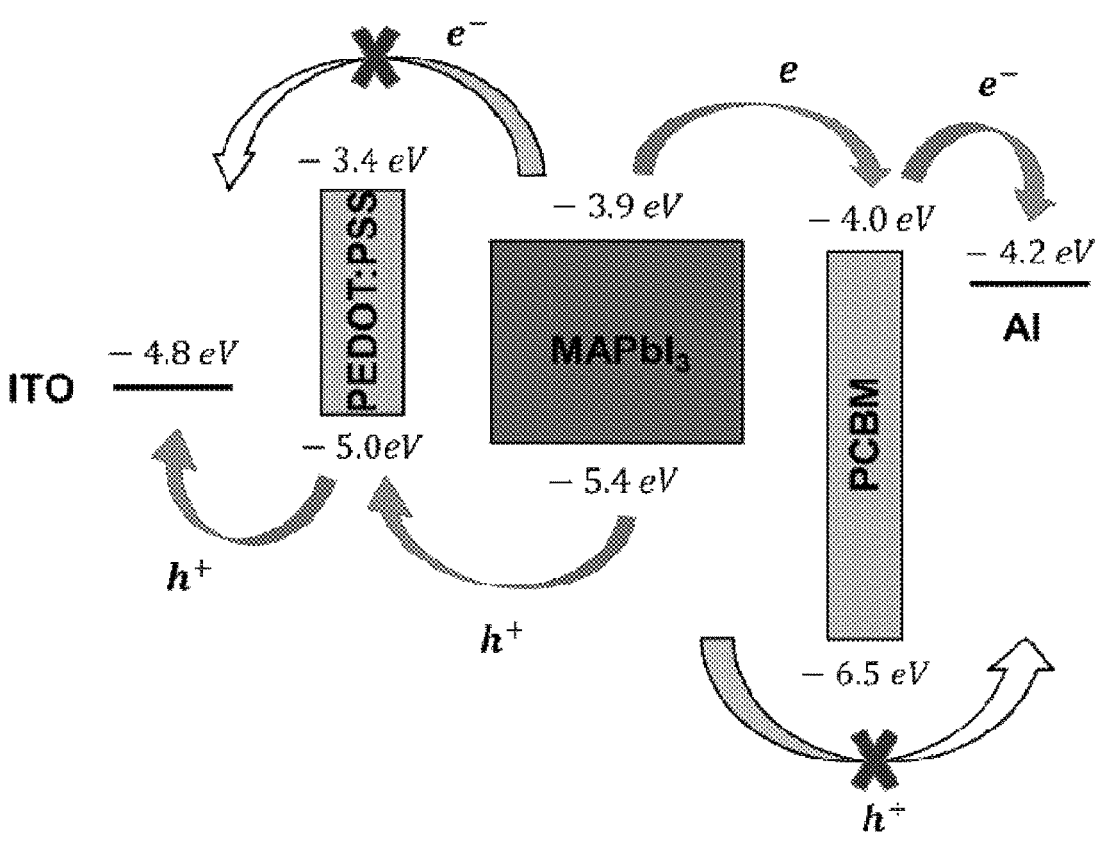
FIG. 3 is a schematic representation of the energy band diagram of a perovskite solar cell with the architecture shown in FIG. 2.

A diagram of a crystal of $CH_3NH_3PbI_3$ perovskite is shown in FIG. 1. A diagram of an inverted perovskite solar cell with an architecture of anode (ITO substrate)/hole transport layer (PEDOT:PSS)/Perovskite ($CH_3NH_3PbI_3$)/electron transport layer (PCBM)/cathode (Al) is shown in FIG. 2 with a schematic representation of the band structure shown in FIG. 3. The perovskite active layer can absorb sunlight and generate electron-hole pairs, where the electrons move to the Al cathode through the PCBM electron transport layer (ETL) and the holes accumulate at the ITO anode through the PEDOT:PSS hole transport layer (HTL) (FIG. 3).

Figure 4:
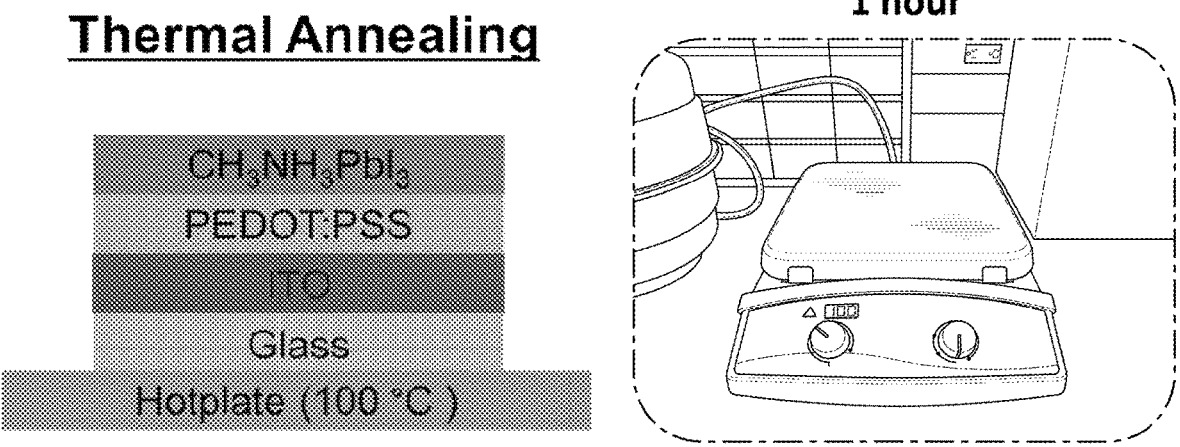
FIG. 4 is a schematic diagram of the thermal annealing of a perovskite solar cell.
Figure 5:
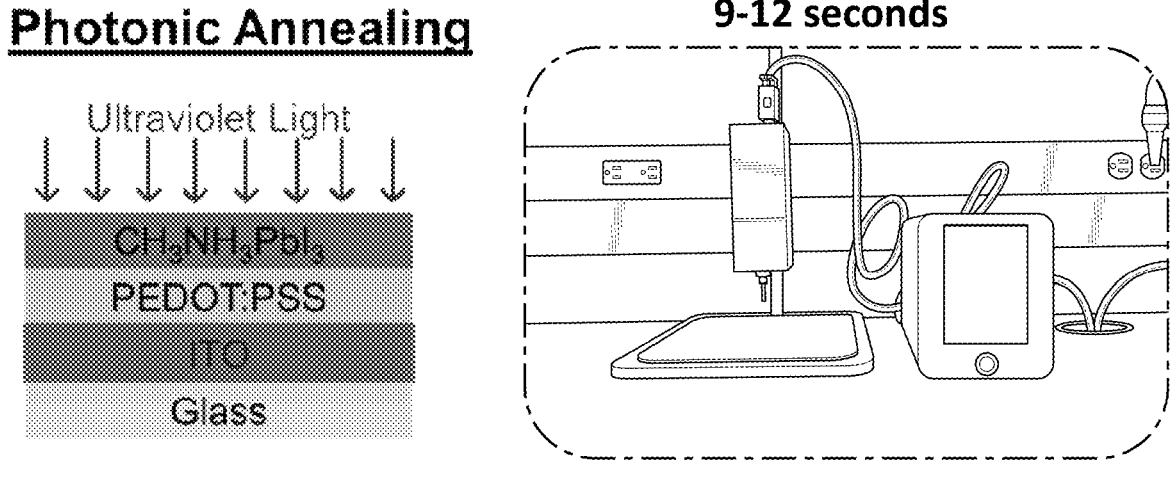
FIG. 5 is a schematic diagram of the photonic annealing of a perovskite solar cell.
Figure 6:
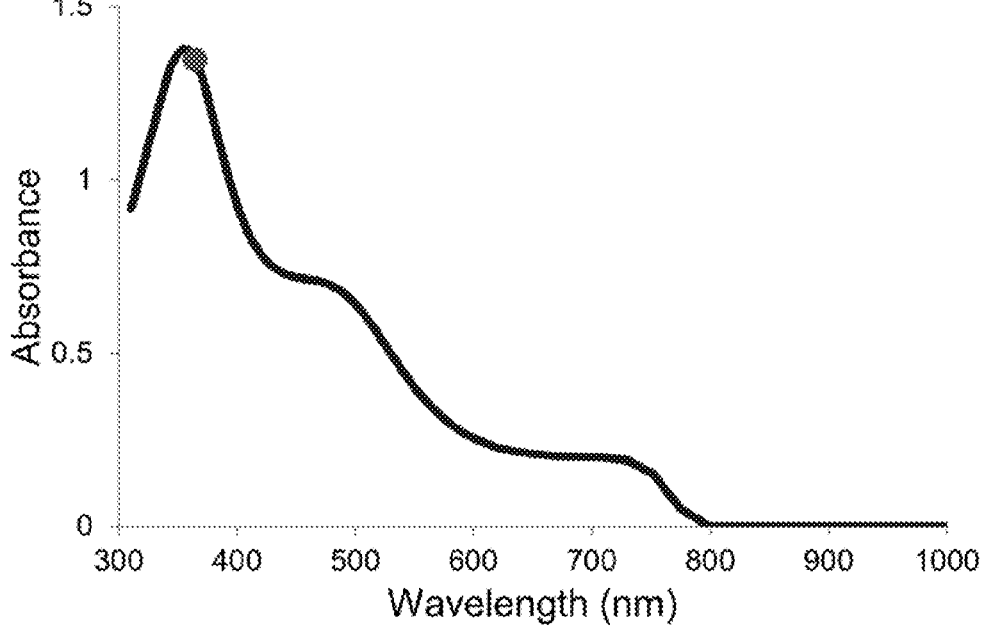
FIG. 6 is an absorbance spectrum of a perovskite material.
Figure 7:
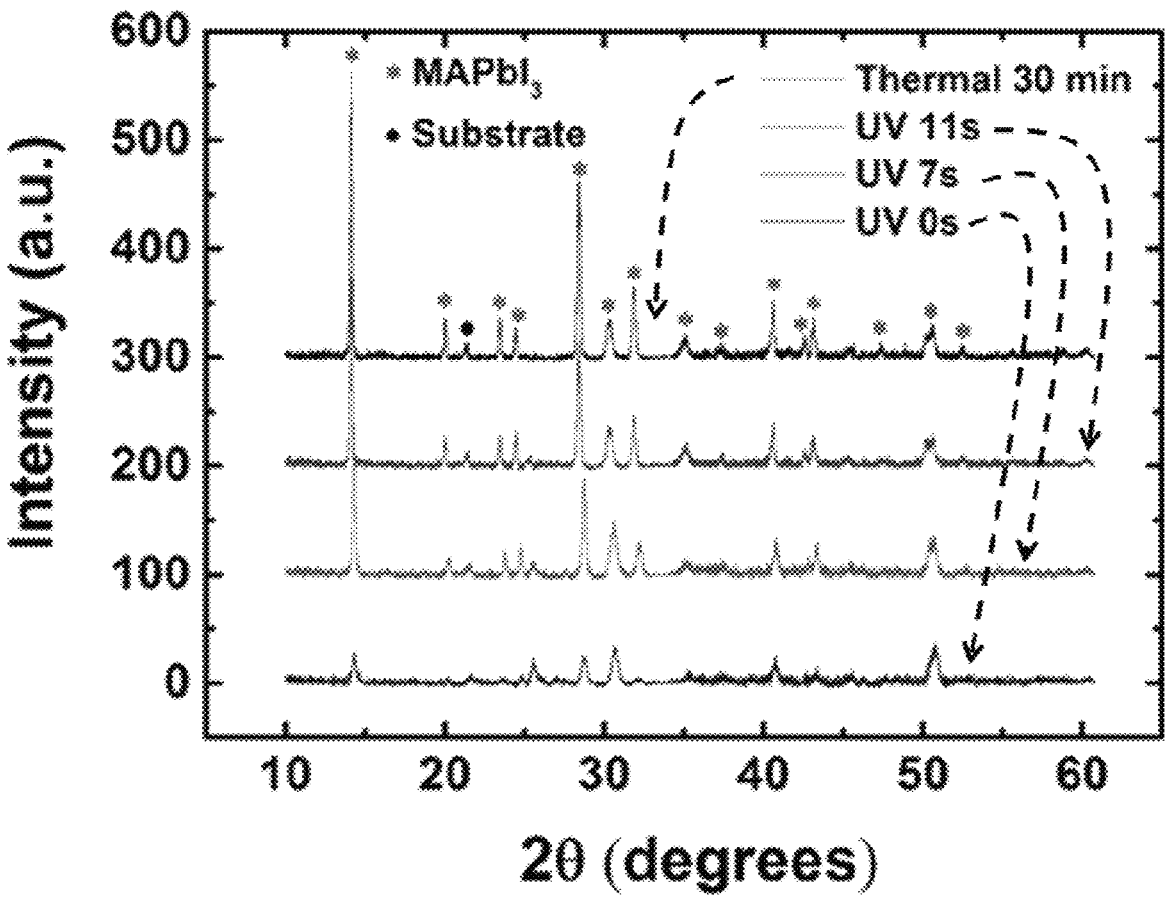
FIG. 7 is the X-ray diffraction spectra for perovskite thin films fabricated using 30 minute hot-plate thermal annealing, 7 second UV-LED annealing, and 11 second UV-LED annealing.

Conventional annealing usually involves heating the perovskite film with a hot plate for 1 hour to get pinhole-free perovskite films (FIG. 4). In contrast, similar or better perovskite films can be obtained with UV LED annealing for less than 12 seconds (FIG. 5). Compared to hot plate heating, UV LED annealing not only significantly reduces the annealing time from 30 minutes to less than 12 seconds, but also improves morphology. The same 20 patterns were observed from the X-Ray Diffraction (XRD) for both annealed perovskite films, and both exhibited peaks for the perovskite only, no crystal peaks from the $PbI_2$ or MAI precursors were observed (FIG. 7). Thus, both methods resulted in complete conversion of the precursors into the perovskite. The absorbance spectrum of the perovskite material is shown in FIG. 6. As can be seen from FIG. 6, the perovskite has a peak absorbance around 354 nm, while the annealing treatment used a 365 nm UV light. By selecting light with wavelengths closest to the perovskite films peak absorbance, unnecessary heating of the underlying materials can be mitigated as the energy is absorbed in the targeted layer. LED irradiation is particularly attractive for these methods as LEDs for specific wavelengths with bandwidths as narrow as 10 nm are available. Further, LEDs are more efficient for energy conversion from electricity to light than other kinds of lamps.

Figure 8:
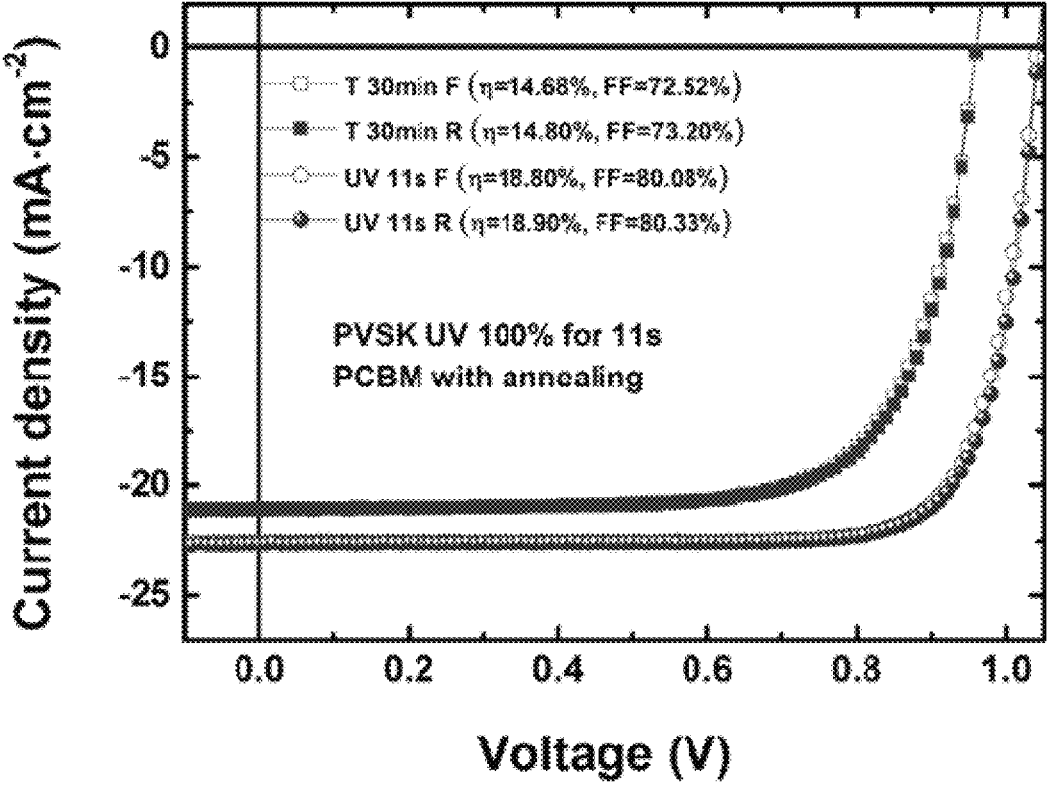
FIG. 8 is a J-V diagram for perovskite solar cells fabricated using 30 minute hot-plate thermal annealing and 12 second UV-LED annealing methods.
Figure 9:
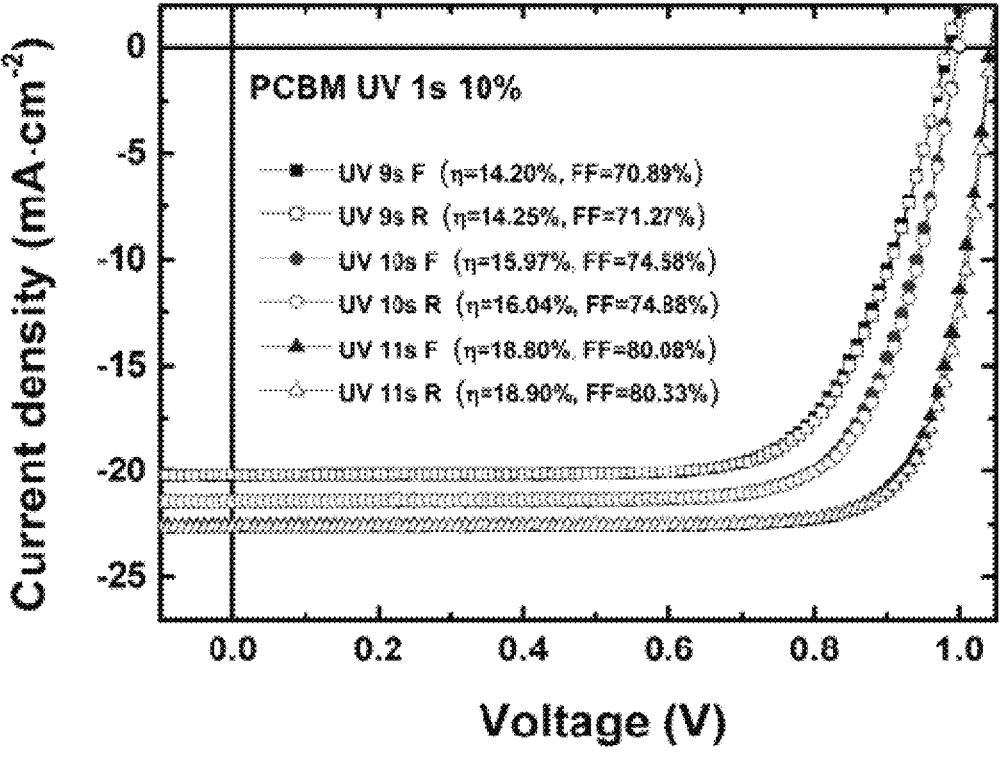
FIG. 9 shows the hysteresis-free J-V characteristics attained for perovskite solar cells with UV annealing of both the perovskite active later (9, 10, 11 seconds) and the PCBM electron transporting layer (1 second).

Perovskite solar cells fabricated with a UV annealing time of 11 s showed the highest power conversion efficiency of 18.9%, which is much larger than the 14.8% power-conversion efficiency observed for a similar perovskite solar cell fabricated by thermal annealing for 30 minutes (FIG. 8). Without annealing of the PCBM layer, the perovskite solar cells show a significant hysteresis behavior as can be seen in the difference between the forward and reverse J-V scan in FIG. 8. With UV annealing of the PCBM layer (1 second and 10% intensity), hysteresis-free J-V characteristics were attained (FIG. 9).

Described herein are methods for rapid LED-based UV light annealing of perovskite layers, enabled by the strong absorption of the perovskites at specific wavelengths. The results demonstrate a power-conversion efficiency (PCE) of 18% with UV light annealing for 9-11 seconds, which was much larger than the power-conversion efficiency obtained for analogous solar cells fabricated by thermal annealing for 1 hour (PCE=14.8%). The rapid layer specific UV annealing of the perovskite active layer is compatible with high-speed printing of any perovskite-based semiconductor devices on flexible substrates.

The methods describe herein exhibit advantages over the current technology. Hot plate annealing at 100° C. for 30 minutes to achieve the desired crystallinity of the perovskite is incompatible with high-speed printing processes. Irradiation with a Xenon lamp cannot provide layer-specific annealing and can cause overheating of an underlying flexible substrate because Xenon lamps provide a broad illumination spectrum, only a small portion of which is UV light.

Example 2

Herein, a process and material engineering approach is described that can realize the scaled-up manufacturing of high-performance, fully printed, perovskite solar cells on flexible substrates. Perovskite solar cells will be described herein.

The lab-scale fabrication of perovskite solar cells usually employs a hot plate for annealing. However, such heating methods result in temperature reconciliation of all stacking layers due to thermal conduction. Herein, photonic annealing and sintering are disclosed for layer-specific treatment.

The photonic treatment can result in a uniform film quality because of an even distribution of radiation intensity. Uniform film properties, such as crystallinity and morphology, can prevent fluctuation of device performance Second, unlike hot plate annealing where heating is through thermal conduction, the absorbed irradiation of the photonic treatment directly provides energy for crystallization. Finally, due to the signature wavelength of the LED and exponential decay of light intensity upon absorption, photonic annealing (e.g., UV photonic annealing) can be concentrated on the chosen film (e.g., the perovskite active layer), resulting in layer-specific treatment if the radiation time is short enough to avoid thermal conduction to the underlying layers.

Herein, a commercially available UV LED light source with an irradiation peak wavelength of 365 nm, which is close to the peak absorption wavelength of 354 nm for a perovskite thin film, was employed to demonstrate that even UV light with high intensity will not damage the perovskite thin film, if the illumination time is short enough. The UV LED light source produces a UV intensity of over 24 W/cm$^2$, equivalent to the radiation intensity of 240 suns but with pure UV. Even at a working distance of ~14 mm, the UV intensity is over 5 W/cm$^2$, equivalent to 50 suns but with pure UV. As shown in FIG. 9, a perovskite solar cell fabricated with an ITO/PEDOT:PSS/Perovskite/PCBM/Al inverted structure showed a power-conversion efficiency of 18.9% with rapid layer-specific UV annealing of the perovskite layer for 9 seconds, and no hysteresis behavior was observed when the PCBM layer was annealed with 10% UV intensity for ~1 second. This result validates that, if well-controlled, not only does ultrafast UV light annealing cause no damage to the perovskite layer, but photonic treatment on the charge transport layer can also remove hysteresis behavior.

The vast majority of the photon energy delivered by the LED can be absorbed by the target perovskite active layer. In a time scale of ~10 seconds, neither was a radical temperature rise of the glass substrates nor was any damage to any layers observed, as evidenced by the efficiency of 18.9% observed for the ITO/PEDOT:PSS/MAPbI$_3$/Al inverted structure. As a result, the pulsing of the LED irradiation was not needed for this specific example. However, pulses can be used to avoid impairment of the underlying layers in other structures. The right pulse duration should supply the right amount of energy for crystallization without any extra thermal energy to overheat the target layer and damage the underlying layers.

For photonic treatment, the LED power and pulse width can be precisely controlled and manipulated. This feature facilitates the identification of the energy required for the perovskite active layer to achieve high-quality film while also avoiding supplying excess energy for the formation of undesired crystal phases in the films. While there is a prevalent conception that UV light degrades perovskites, it is the energy rather than a specific type of light that causes damage to a crystal structure. The following example shows that pulsed irradiation from the proposed UV LEDs can be safely used for annealing and sintering of the perovskite layer without degradation. Irradiating with a UV flux density of $1 \times 10^5$ W·m$^{-2}$ for 20 μs equals an energy density of $2 \times 10^{-4}$ J·cm$^{-2}$, similar to the dose of UV illumination for only 0.05 seconds from AM 1.5 irradiation, which has a flux density of $4.6 \times 10^{-3}$ W·m$^{-2}$ under 400 nm.

Other advantages which are obvious and which are inherent to the invention will be evident to one skilled in the art. It will be understood that certain features and sub-combinations are of utility and may be employed without reference to other features and sub-combinations. This is contemplated by and is within the scope of the claims. Since many possible embodiments may be made of the invention without departing from the scope thereof, it is to be understood that all matter herein set forth or shown in the accompanying drawings is to be interpreted as illustrative and not in a limiting sense.

The methods of the appended claims are not limited in scope by the specific methods described herein, which are intended as illustrations of a few aspects of the claims and any methods that are functionally equivalent are intended to fall within the scope of the claims. Various modifications of the methods in addition to those shown and described herein are intended to fall within the scope of the appended claims. Further, while only certain representative method steps disclosed herein are specifically described, other combinations of the method steps also are intended to fall within the scope of the appended claims, even if not specifically recited. Thus, a combination of steps, elements, components, or constituents may be explicitly mentioned herein or less, however, other combinations of steps, elements, components, and constituents are included, even though not explicitly stated.

What is claimed is:

1. A method comprising:
   irradiating a precursor layer with a light source, the precursor layer comprising a perovskite precursor composition;
   wherein the light source emits radiation consisting essentially of wavelengths within 50 nm of the wavelength of maximum absorbance ($\lambda_{max}$) of the perovskite precursor composition;
   wherein the light source is a UV light emitting diode (UV-LED) or an array of UV-LEDs for rapid and large-area exposure without scanning over the precursor layer; and
   wherein the method substantially excludes thermal conduction outside the precursor layer;
   thereby layer-specifically annealing the precursor layer and converting the perovskite precursor composition into a perovskite and thus converting the precursor layer into a perovskite layer.

2. The method of claim 1, wherein the light source consists essentially of wavelengths within 30 nm of $\lambda_{max}$ of the perovskite layer.

3. The method of claim 1, wherein the $\lambda_{max}$ is from 250 nm to 400 nm.

4. The method of claim 1, wherein the light source emits radiation having a spectral width of 50 nm or less.

5. The method of claim 1, wherein the precursor layer is irradiated for a total amount of time of from 1 millisecond to 1 minute.

6. The method of claim 1, wherein the perovskite layer has an average thickness of from 300 nm to 1000 nm.

7. The method of claim 1, wherein the precursor layer is prepared by a solution processing technique and/or a roll-to-roll printing process.

8. The method of claim 1, wherein the light source emits pulsed radiation and irradiating the precursor layer comprises applying a plurality of pulses.

9. The method of claim 8, wherein each pulse is from 1 microsecond to less than 1 minute.

10. The method of claim 1, wherein the perovskite layer comprises a perovskite material having the formula $QZX_3$, wherein Q refers to an organic group or an inorganic group, Z represents a metal, and X is a halide.

11. The method of claim 10, wherein Q is an inorganic group.

12. The method of claim 10, wherein Q is methylammonium, formamidinium, Cs, or a combination thereof.

13. The method of claim 10, wherein Z is Pb, Sn, Ge, or combinations thereof.

14. The method of claim 10, wherein X is I, Cl, Br, or a combination thereof.

15. The method of claim 10, wherein the perovskite comprises $CH_3NH_3PbI_3$, $CH_3NH_3PbI_{3-x}Cl_x$, $(CH(NH_2)_2)_yCs_z(CH_3NH_3)_{1-y-z}PbI_{3-x}Br_x$, derivatives thereof, or combinations thereof.

\* \* \* \* \*